(12) United States Patent
Endo

(10) Patent No.: US 6,385,103 B1
(45) Date of Patent: May 7, 2002

(54) SEMICONDUCTOR MEMORY DEVICE HAVING A CIRCUIT FOR TESTING MEMORIES

(75) Inventor: Shunsuke Endo, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/773,622

(22) Filed: Feb. 2, 2001

(30) Foreign Application Priority Data

Sep. 1, 2000 (JP) ........................................ 2000-264849

(51) Int. Cl.[7] .............................................. G11C 29/00
(52) U.S. Cl. ........................ 365/201; 365/205; 365/149
(58) Field of Search .................................. 365/201, 205, 365/222, 149, 200

(56) References Cited

U.S. PATENT DOCUMENTS 5,666,317 A * 9/1997 Tanida et al. ................ 365/201
5,905,682 A * 5/1999 Gans et al. ................... 365/201
5,956,281 A * 9/1999 Nakai et al. .................. 365/222

FOREIGN PATENT DOCUMENTS

| JP | 63-308790 | * 12/1988 |
| JP | 1-133287 | * 5/1989 |
| JP | 6-29364 | 2/1994 |

* cited by examiner

Primary Examiner—Huan Hoang
(74) Attorney, Agent, or Firm—McDermott, Will & Emery

(57) ABSTRACT

A semiconductor memory device includes a sense amplifier provided for the bit lines. To the sense amplifier, an internal power supply voltage and a negative voltage or a ground voltage are supplied. In the normal operation mode, first and second transistors are turned on, and the bit line is amplified to the internal power supply voltage or the ground voltage. In the test mode, first and third transistors turn on, and the bit line is amplified to the power supply voltage or the negative voltage. Thus, potential difference between adjacent storage nodes is increased.

5 Claims, 11 Drawing Sheets

SEMICONDUCTOR MEMORY DEVICE HAVING A CIRCUIT FOR TESTING MEMORIES

BACKGROUND OF THE INVENTION

1. Field of the Invention

The present invention relates to a semiconductor memory device and, more specifically, to a semiconductor memory device including a circuit detecting a defect of a memory cell.

2. Description of the Background Art

In the process of manufacturing a memory cell, a short-circuit possibly occurs between a gate of a memory cell transistor and a bit line, between the gate of the memory cell transistor and a storage node of a memory cell capacitor, or between adjacent storage nodes, because of etching residue or foreign matters.

Such a short-circuit causes malfunction of the memory cell. Therefore, a conventional semiconductor memory device includes a test circuit for testing a memory cell array, to detect any defect.

As regards the short-circuit between the storage nodes, the speed of detecting the short-circuit can be increased by increasing potential difference between the short-circuited storage nodes.

The bit line connected to the sense amplifier, however, has the amplitude up to 0V only. Therefore, in the conventional semiconductor integrated circuit, a potential of 0V is applied as the data of "L" level to the storage node of one cell, and a potential higher than normal is applied as the "H" level data, to the storage node of the other cell of the pair.

When the high potential corresponding to the "H" data is increased so as to widen the potential difference, the potential difference between the storage node and the cell plate also becomes larger, possibly damaging a dielectric film existing between the storage node and the cell plate.

On the other hand, as the potential on the "H" data cannot be increased, it takes time for detection.

SUMMARY OF THE INVENTION

An object of the present invention is to provide a semiconductor memory device including a circuit capable of efficiently detecting a short-circuit between storage nodes.

In accordance with the present invention, the semiconductor memory device includes: a memory cell array including memory cells each having a memory cell capacitor storing charges and a memory cell transistor, word lines connected to the gates of memory cell transistors and bit lines connected to storage nodes of the memory cell capacitors; and a sense amplifier connected to the bit lines and sensing the charges stored in the memory cells as data. The sense amplifier circuit amplifies the bit line to a ground potential or a positive power supply potential in a normal operation mode, and amplifies the bit line to a positive power supply potential or a negative power supply potential in a test mode. Preferably, the semiconductor memory device further includes an activation signal generating circuit generating an activation signal controlling activation of the sense amplifier circuit in the normal operation mode and generating a test activating signal controlling activation of the sense amplifier circuit in the test mode. The sense amplifier circuit includes a circuit setting the bit line to the ground potential when the activation signal is activated, and setting the bit line to the negative potential when the test activating signal is activated.

Specifically, a substrate potential of the memory cell transistor is used as the negative potential. Alternatively, the negative potential is supplied externally.

Specifically, in the test mode, storage nodes adjacent to each other are set to the positive power supply potential and the negative potential, respectively.

Specifically, the semiconductor memory device further includes a supplying circuit supplying from the outside a cell plate voltage to be supplied to the cell plate of the memory cell capacitor, and by the supplying circuit, the cell plate voltage is set to an intermediate potential between the positive power supply potential and the negative potential.

Therefore, in the semiconductor memory device described above, the potential difference between the storage nodes can be made higher than in the conventional semiconductor memory device. Accordingly, it is possible to enhance the ability to, detect any short-circuit between the storage nodes.

Further, as a higher stress can be applied as compared with the conventional semiconductor memory device, the test time can be reduced.

Further, it is possible not only to detect a defective cell by the detection test in the wafer test stage but to replace a defective cell with a redundant cell. This leads to improved production yield.

As the potential difference is widened by utilizing a negative potential, stress applied to unrelated portions other than the storage node can be prevented.

Further, as the internally generated substrate potential itself is used as the negative potential, increase in the number of circuits to implement the present function can be suppressed.

Alternatively, by supplying the negative potential from the outside, the chip operation in the test mode can be stabilized.

Further, by adjusting the cell plate voltage, the burden on the dielectric film between the storage node and the cell plate can be alleviated. In a test in which a high stress is applied, a margin for the chip can be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
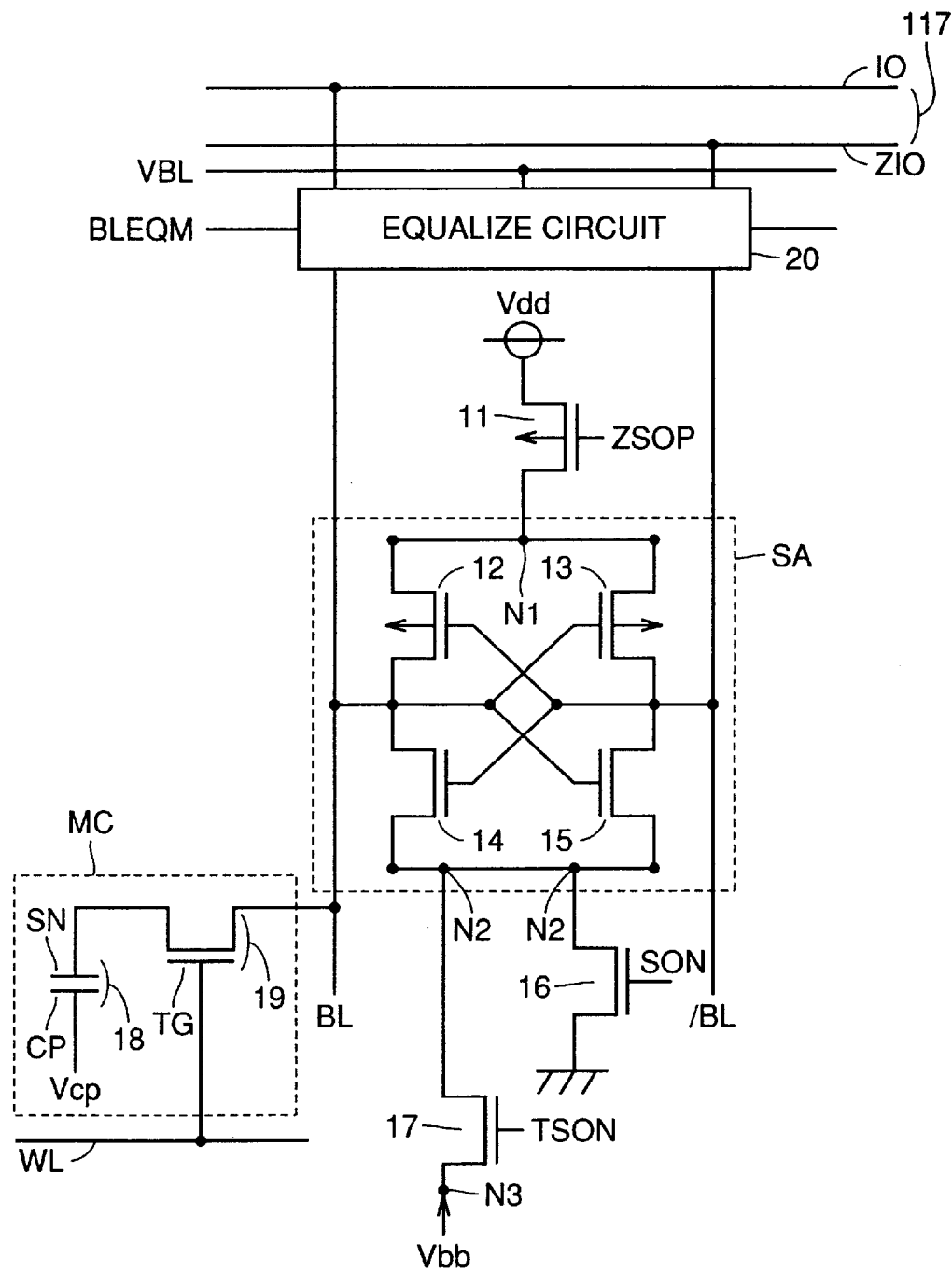
FIG. 1 shows a configuration of a main portion of a semiconductor memory device 1000 in accordance with a first embodiment of the present invention.

The semiconductor memory device in accordance with the embodiments of the present invention will be described with reference to the figures. In the figures, the same or corresponding portions will be denoted by the same reference characters and descriptions thereof will not be repeated.

First Embodiment

The configuration of a main portion of a semiconductor memory device 1000 in accordance with the first embodiment will be described. The semiconductor memory device, 1000 in accordance with the first embodiment includes, as shown in FIG. 1, a configuration (transistor 17) for charging the storage node to a negative potential, at the time of detecting any short-circuit between the storage nodes. In the following, a signal represented by a certain reference character, and a signal having "Z" added to the certain reference character represent mutually inverted signals.

Referring to FIG. 1, semiconductor memory device 1000 includes memory cells arranged in a matrix of rows and columns, a plurality of word lines arranged corresponding to the rows, and a plurality of bit lines arranged corresponding to the columns. FIG. 1 shows a memory cell MC connected to a word line WL and a bit line BL.

Memory cell MC includes a memory cell transistor 19 and a memory cell capacitor 18. Memory cell transistor 19 is connected between the corresponding bit line and a storage node SN of the memory cell capacitor 18, with its gate TG connected to the corresponding word line WL. To a cell plate CP of memory cell capacitor 18, a cell plate voltage Vcp is supplied.

A write data is transmitted or data read from the memory cell is externally output, through a pair of data input/output lines IO and ZIO.

For every bit line pair, an equalize circuit 20 equalizing and precharging the bit line pair is provided. Equalize circuit 20 equalizes the bit line pair in response to an equalize signal BLEQM, and precharges the bit line pair to an intermediate voltage (precharge voltage VBL).

For every bit line pair, a sense amplifier SA is provided. Sense amplifier SA includes PMOS transistors 12 and 13 and NMOS transistors 14 and 15.

Transistor 12 is connected between a node N1 and a bit line BL and has its gate connected to a bit line /BL. Transistor 13 is connected between node N1 and bit line /BL and has its gate connected to bit line BL. Transistor 14 is connected between a node N2 and a bit line BL and has its gate connected to a bit line /BL. Transistor 15 is connected between node N2 and bit line /BL, and has its gate connected to bit line BL.

Between node N1 and a power supply voltage Vdd, a PMOS transistor 11 is connected, which receives at its gate a sense amplifier activating signal ZSOP. Between node N2 and a ground voltage GND, an NMOS transistor 16 is connected, which receives, at its gate, sense amplifier activating signal SON.

Further, between nodes N2 and N3, an NMOS transistor 17 is connected, which receives at its gate a sense amplifier activating signal TSON for the test mode.

Figure 2:
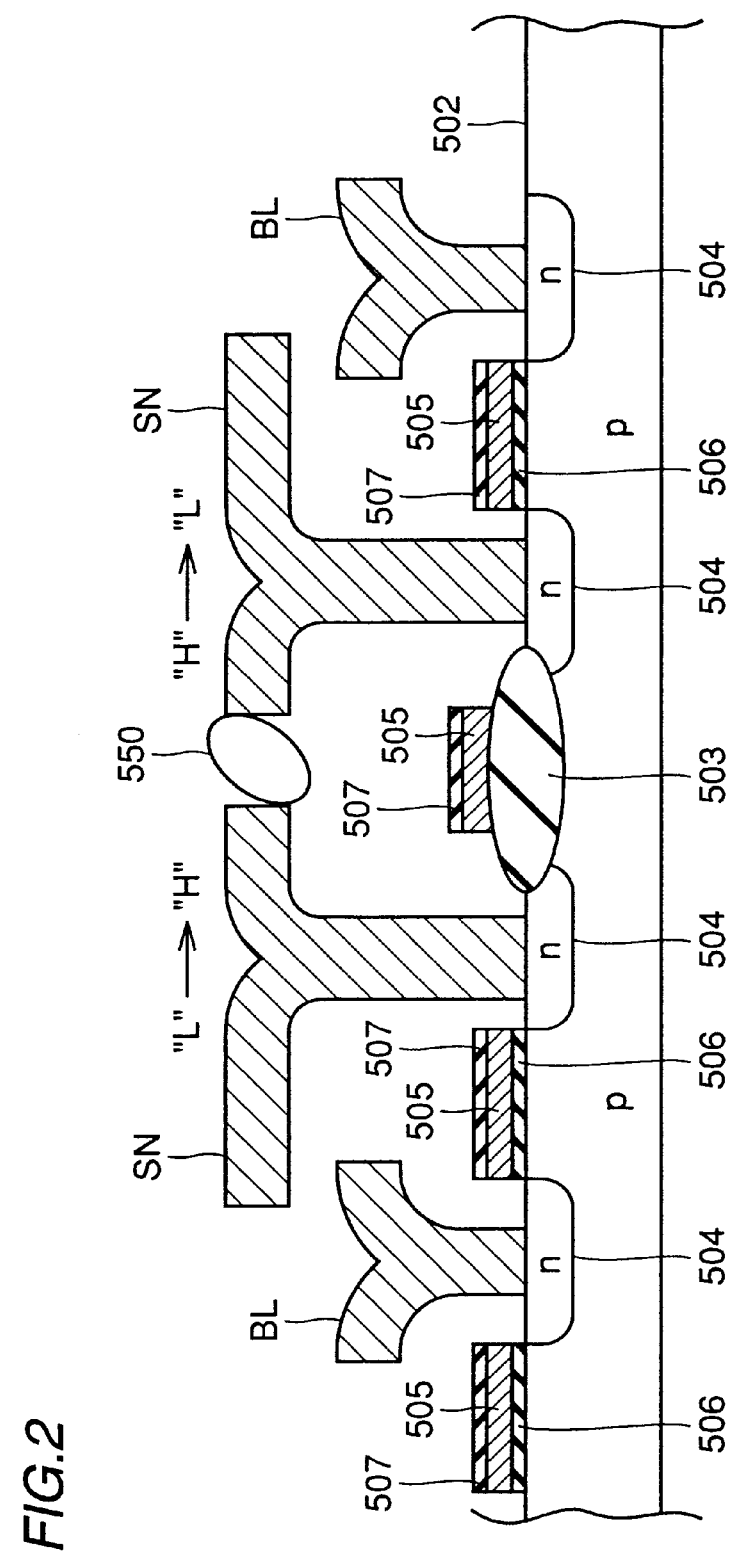
FIG. 2 is a cross sectional view schematically illustrating a short-circuit between storage nodes.

The mechanism of a defect detected in accordance with the present invention will be described in the following. Referring to FIG. 2, on a surface of a P type well 502 forming the substrate, impurity regions (source drain regions) 504 and element isolating insulating film 503 are formed at prescribed intervals.

A memory cell transistor is formed by a pair of source drain regions formed at a prescribed distance at the surface of the substrate and a gate 505. Gate 505 is formed on the region between the source drain regions, with a gate oxide film 506 interposed. On gate 505, an insulating film 507 is formed.

A bit line BL is formed to be electrically connected to one of the pair of source drain regions of the memory cell transistor. A storage node SN is formed to be electrically connected to the other one of the pair of source drain regions of the memory cell transistor. By the storage node SN, a dielectric film and a cell plate provided opposing to the storage node SN with the dielectric film interposed, a memory cell capacitor is formed.

When there is a foreign matter 550 between the storage nodes and the storage nodes which are charged to opposite potentials are short-circuited, respective potentials are transmitted to the counterpart short-circuited storage nodes. Accordingly, respective potentials are cancelled, and the written data is damaged, resulting in an error.

Here, the larger the potential difference between the storage nodes, the faster the potential of the counterpart will be canceled, and a short-circuit with a high resistance can also be detected, and therefore ability of detection is improved.

Therefore, in the first embodiment, a substrate voltage (negative voltage) to be supplied to the substrate forming the memory cell transistor, generated inside the chip, is applied to node N3 shown in FIG. 1, whereby potential difference between the storage nodes is increased.

Sense amplifier activating signals ZSOP, SON and TSON are generated by a row controller 106, which will be described later. Sense amplifier activating signal TSON is activated in the test mode, in which any short-circuit between the storage nodes is detected.

Figure 3:
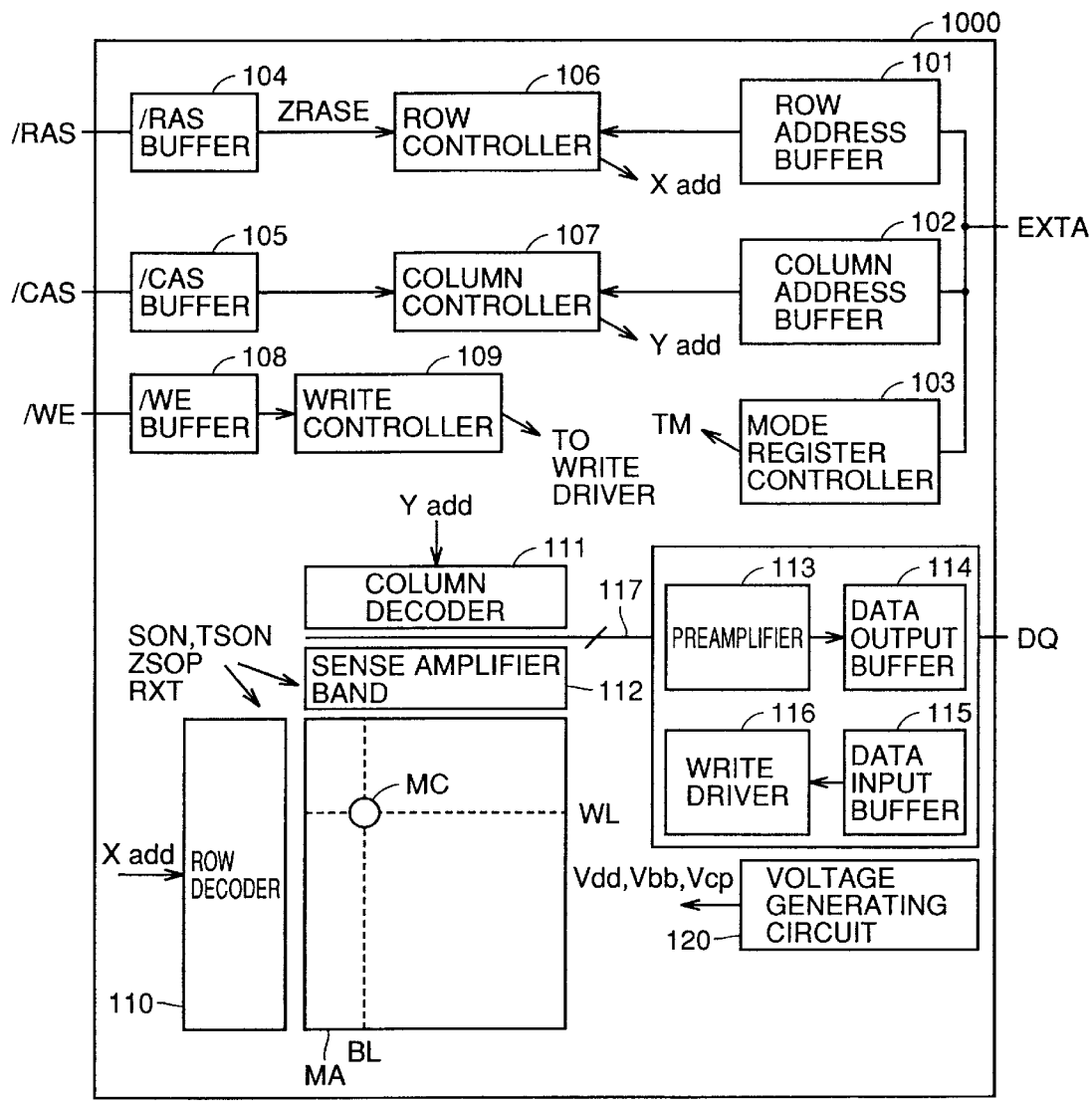
FIG. 3 is a block diagram schematically representing an overall configuration of the semiconductor memory device 1000 in accordance with the first embodiment.

The overall configuration of semiconductor memory device 1000 in accordance with the first embodiment will be described with reference to FIG. 3. Semiconductor memory device 1000 includes: a memory cell array MA; a row address buffer 101 taking an external row address signal from an input external address EXTA; a column address buffer 102 taking an external column address signal from the external address EXTA; a mode register controller 103 recognizing the external address EXTA as a mode register set, and generating a test mode signal TM; a /RAS buffer 104 taking an external row address strobe signal /RAS; a /CAS buffer 105 taking an external column address strobe signal /CAS; a row controller 106 controlling selection of a row in accordance with a signal ZRASE output from /RAS buffer 104 and an output from row address buffer 101; a column controller 107 controlling selection of a column in accordance with an output of /CAS buffer 105 and an output of column address buffer 102; a /WE buffer 108 taking an external write enable signal /WE; and a write controller 109 outputting to the write driver a control signal for write control in accordance with an output of /WE buffer 108.

Mode register controller 103 outputs a test mode signal TM to row controller 106 in a row related test mode.

Row controller 106 generates an X address signal Xadd, sense amplifier activating signals SON, ZSOP and TSON for activating the sense amplifier, and a signal RXT related to rising of a word line.

Semiconductor memory device further includes: a row decoder 110 selecting a word line in accordance with the X address signal Xadd and the signal RXT output from row controller 106; a column decoder 111 selecting a column upon reception of a Y address signal Yadd output from column controller 107; a sense amplifier band 112 including a sense amplifier SA detecting data of memory cells connected to the selected word line, an IO gate (IO: input output) for connecting the selected column with a data input/output line pair 117, an equalize circuit for equalizing the bit line pair, and so on; a preamplifier 113 amplifying a signal received from data input/output line pair 117; a data output buffer 114 taking an output of preamplifier 113 and providing data to a data input/output pin DQ; a data input buffer 115 taking data from data input/output pin DQ; a write driver 116 transmitting the data from data input buffer 115 to data input/output line pair 117; and a voltage generating circuit 120 generating an internal voltage.

Voltage generating circuit 120 generates a substrate voltage Vbb, internal power supply voltage Vdd, cell plate voltage Vcp and so on. Substrate voltage Vbb is supplied to the substrate forming the memory cell transistor, and to node N3.

Figure 4:
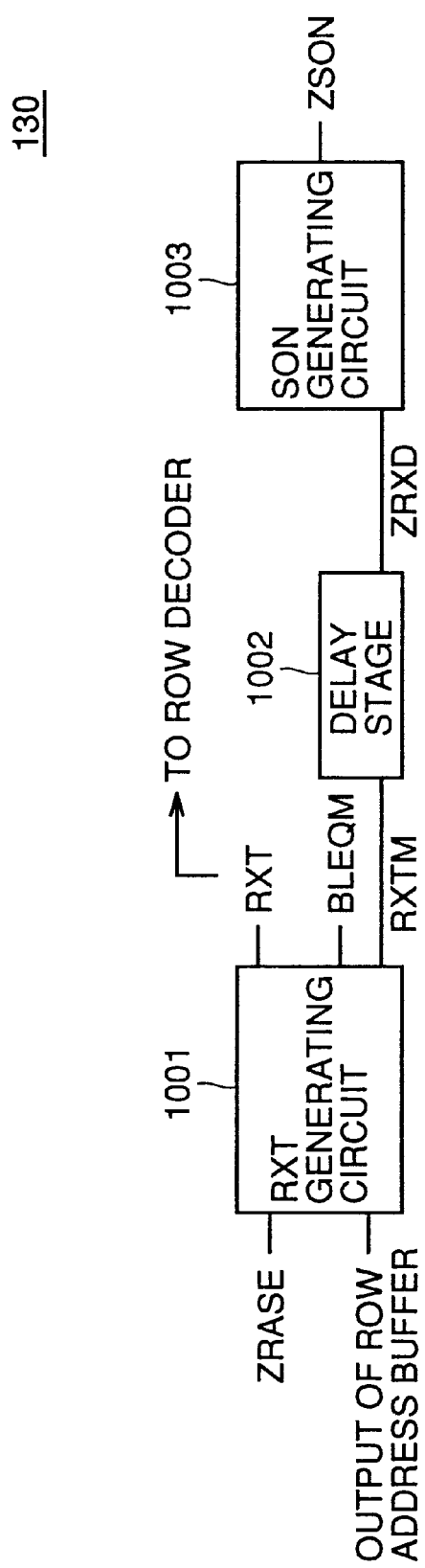
FIG. 4 is a circuit diagram representing a circuit 130 included in a row controller 106 in accordance with the first embodiment.

Row controller 106 will be described in the following. Row controller 106 includes a circuit 130 shown in FIG. 4. The circuit 130 shown in FIG. 4 includes an RXT generating circuit 1001, a delay stage 1002 and an SON generating circuit 1003. RXT generating circuit 1001 outputs the signal RXT, a signal BLEQM related to bit line equalization and a signal RXTM.

The signal RXT is used for selecting a word line, in row decoder 110. The signal RXTM is generated by incorporating the information that "an address is input", in the signal ZRASE.

Delay stage 1002 delays the signal RXTM and provides a signal ZRXD, which is related to activation of the sense amplifier. Delay stage 1002 delays the signal RXTM only by that time period until the potential of the word line fully rises.

The SON generating circuit 1003 receives the signal ZRXD, and outputs the sense amplifier activating signal ZSON.

Figure 5:
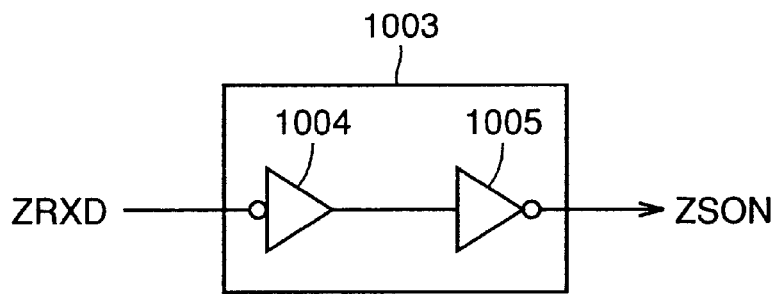
FIG. 5 is a circuit diagram representing a configuration of an SON generating circuit 1003 in accordance with the first embodiment.

As shown in FIG. 5, SON generating circuit 1003 includes inverters 1004 and 1005. Inverter 1004 inverts the signal ZRXD, and inverter 1005 inverts the output of inverter 1004 and provides the signal ZSON.

Figure 6:
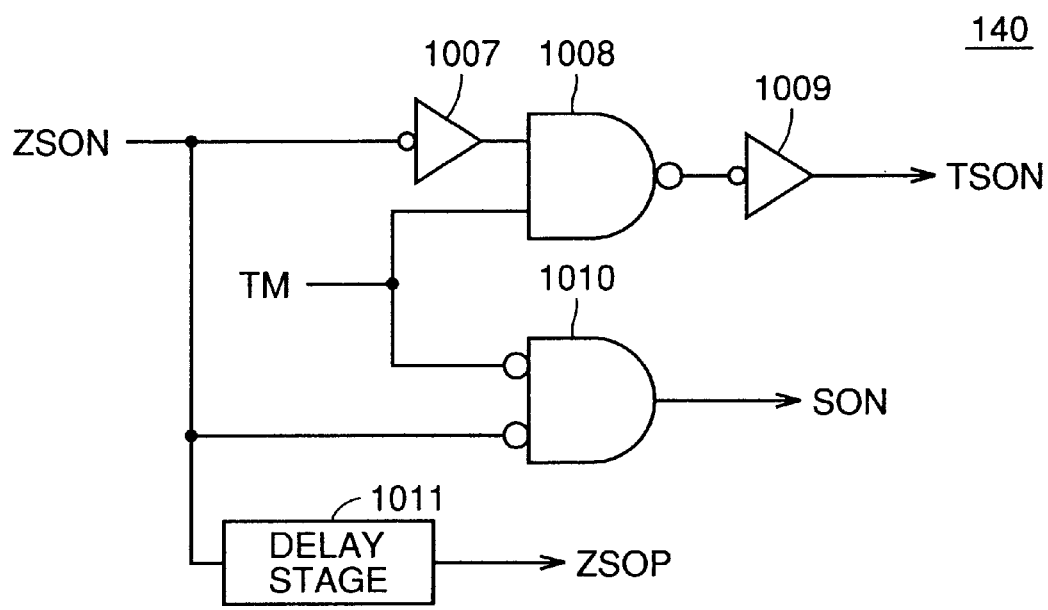
FIG. 6 is a circuit diagram showing a circuit 140 included in the row controller 106 in accordance with the first embodiment.

Row controller 106 further includes a circuit 140 shown in FIG. 6. The circuit 140 shown in Fig.,6 includes an inverter 1007 receiving and inverting the signal ZON; an NAND circuit 1008 receiving an output of inverter 1007 and the test mode signal TM; a logic circuit 1010 receiving the signal ZSON and the test mode signal TM and outputting the sense amplifier activating signal SON; an inverter 1009 inverting an output of NAND circuit 1008 and outputting sense amplifier activating signal TSON for the test mode; and a delay stage 1011 delaying the signal ZSON and outputting the signal ZSOP.

When the test mode signal TM is at the L level (normal operation mode), sense amplifier activating signal TSON attains to the L level. Sense amplifier activating signal SON attains to the H/L level in accordance with the signal ZSON.

When the test mode signal TM is at the H level (test mode), sense amplifier activating signal SON attains to the H level. Sense amplifier activating signal TSON attains to the H/L level in accordance with the signal ZSON.

The signal ZSOP attains to the H/L level in accordance with the signal ZSON, no matter whether the test mode signal TM is at the H level or L level.

In the normal operation mode, by the sense amplifier activating signal SON, the NMOS transistor on the side of the ground potential of sense amplifier SA is turned on. Thus, the potential of the bit line BL or /BL is drawn to the GND.

In the test mode, by the sense amplifier activating signal TSON, the NMOS transistor connected to Vbb potential of sense amplifier SA is turned on. Thus, the potential of the bit line BL or /BL is charged to Vbb (<0V).

Figure 7:
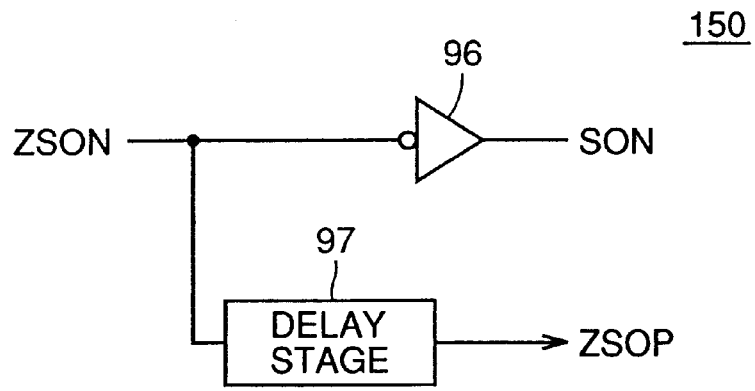
FIG. 7 shows a configuration of a conventional SON generating circuit.

The conventional SON generating circuit includes, in place of the circuit 140, a circuit 150 shown in FIG. 7. The circuit 150 includes an inverter 96 and a delay stage 97. Inverter 96 inverts the signal ZSON and outputs a sense amplifier activating signal SON. Delay stage 97 delays the signal ZSON and outputs the signal ZSOP. Therefore, when a sense amplifier activating signal SON at the H level is output, a signal ZSOP at the L level is generated after a delay.

Figure 8:
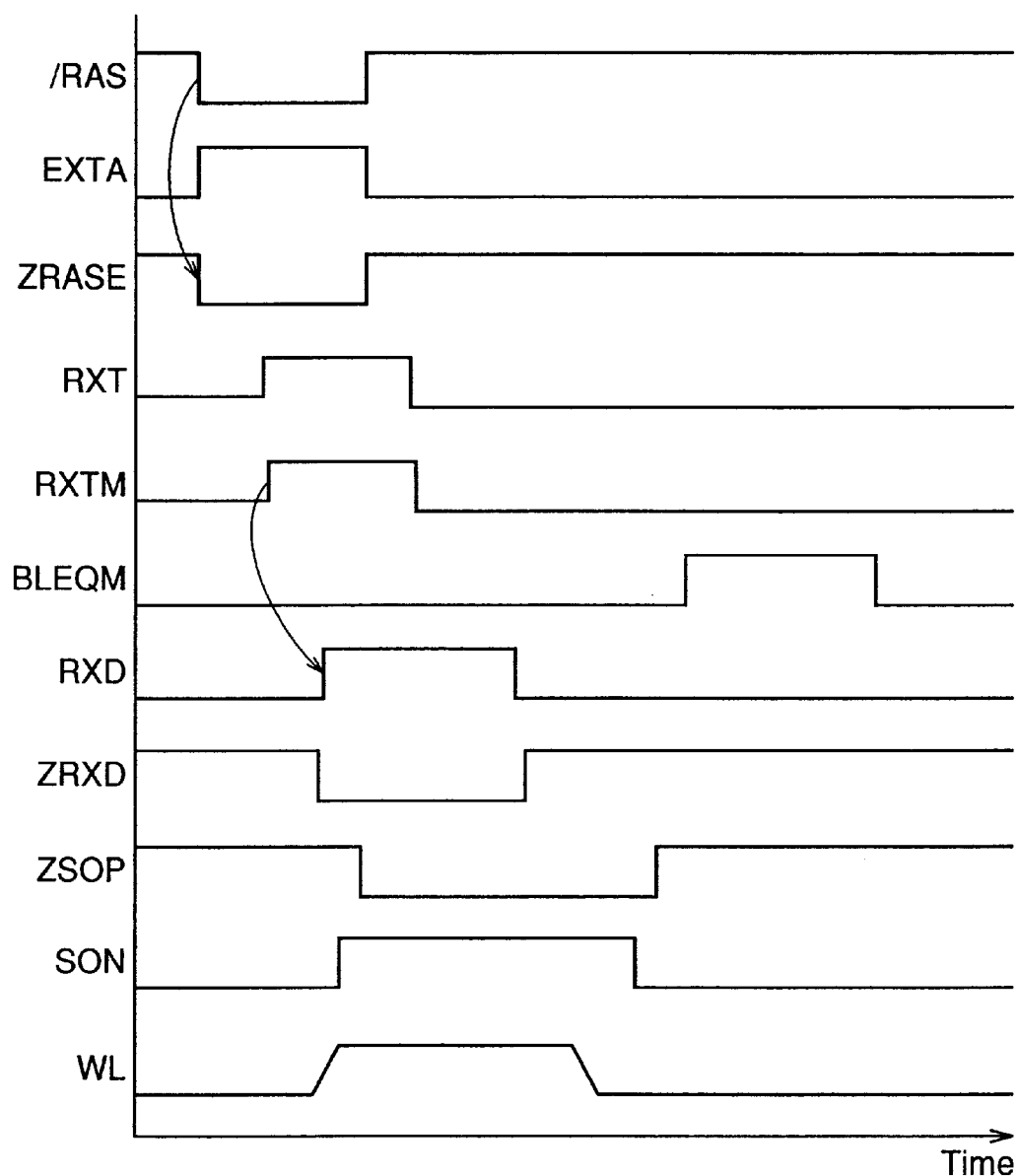
FIG. 8 is a timing chart representing a basic operation of the semiconductor memory device 1000 in accordance with the first embodiment.

The basic operation of semiconductor memory device 1000 will be described. Referring to FIG. 8, the external row address strobe signal /RAS and the external address EXTA are input. The signal ZRASE is output from /RAS buffer 104. In response to the signal ZRASE and the information that the external address EXTA has been input, signals RXT and RXTM are generated. Then, the signal RXTM is delayed and signals ZRXD and RXD are generated.

In response to the signal ZRXD, sense amplifier activating signal SON attains to the H level. At this time point, selection of a word line starts. A corresponding memory cell transistor is rendered conductive. By the sense amplifier activating signal SON, the NMOS transistor of sense amplifier SA is activated.

Following the sense amplifier activating signal SON, the sense amplifier activating signal ZSOP attains to the L level. By the sense amplifier activating signal ZSOP, the PMOS transistor of sense amplifier SA is activated.

In a reading operation, for example, the charges stored in the storage node are transmitted to the bit lines BL, /BL. Thus, the potential of the bit line changes. The change in potential of the bit line is recognized by sense amplifier SA. Whether the potential is high/low is read as "data".

After the end of the sensing operation, the equalize signal BLEQM is activated. The bit line pair is equalized precharged, to be ready for the next operation.

Figure 9:
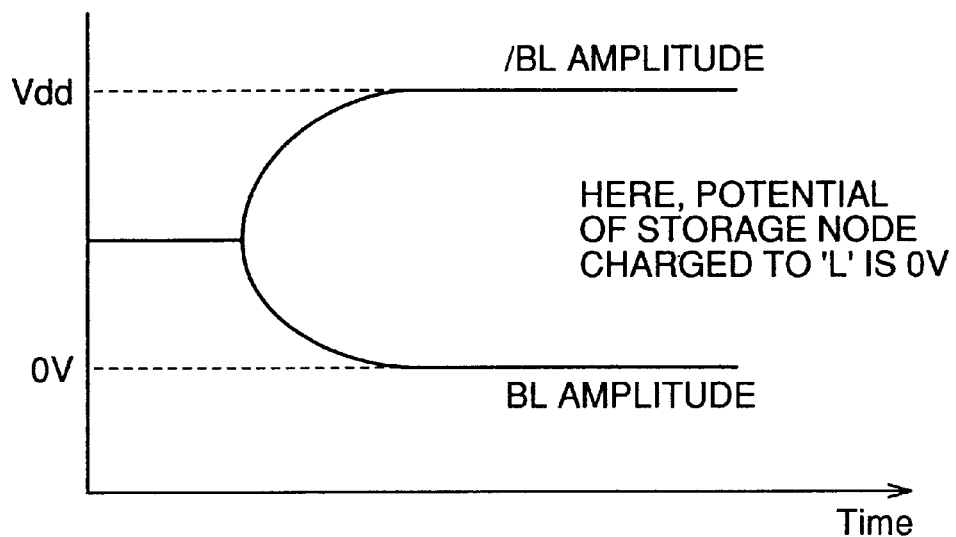
FIG. 9 is a timing chart representing a bit line amplitude in a test mode in the conventional semiconductor memory device.
Figure 10:
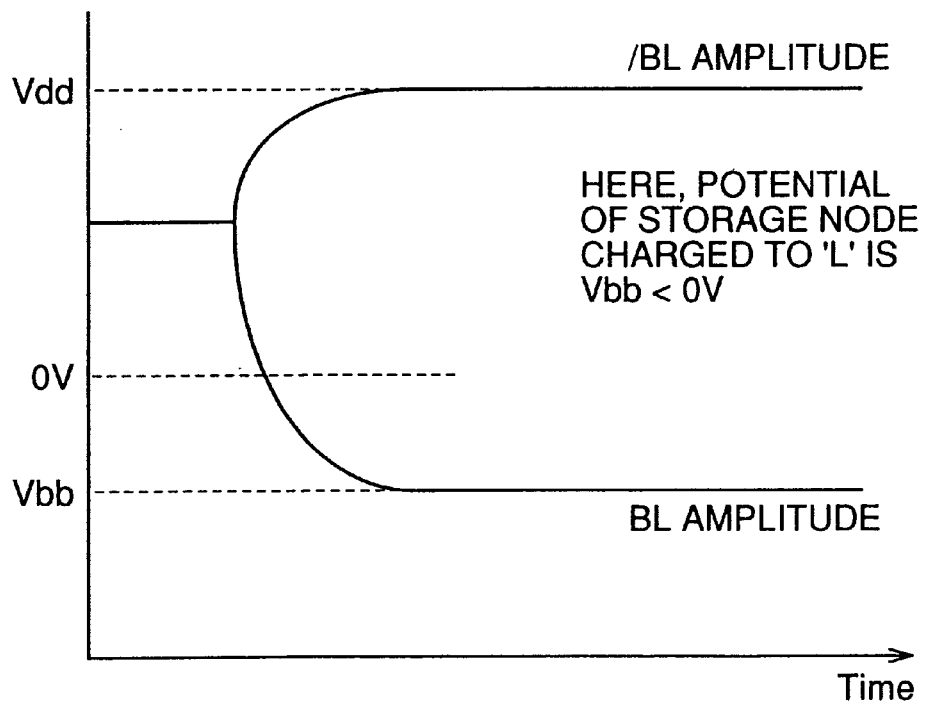
FIG. 10 is a timing chart representing a bit line amplitude in the test mode in the semiconductor memory device 1000 in accordance with the first embodiment.

The amplitude of the bit line will be described in detail in the following. FIG. 9 shows the bit line amplitude in the test mode in the conventional semiconductor memory device, and FIG. 10 represents the bit line amplitude in the test mode in the semiconductor memory device 1000. It is assumed that the charges stored in the memory cell connected to the bit line BL and the charges stored in the memory cell connected to the bit line /BL have opposite potentials.

Referring to FIG. 9, first, the bit line pair is set to the precharge potential VBL by the equalize circuit. A row selecting operation is performed and the sense amplifier is activated.

The storage node SN of the memory cell connected to the bit line /BL ("H" data) is charged to the potential "H", while the storage node SN of the memory cell connected to the bit line BL ("L" data) is charged to the potential "L". Here, the potential "H" corresponds to the internal power supply voltage Vdd supplied from the positive power supply of sense amplifier SA, and the potential "L" is the voltage 0V supplied from the ground GND of the sense amplifier.

When the storage nodes SN of adjacent memory cells are charged to opposite potentials, the potential difference between mutually adjacent storage nodes will be (Vdd−0)= Vdd.

Referring to FIG. 10, in the semiconductor memory device 1000, when the row selecting operation is performed and the sense amplifier is activated, the storage node SN of the memory cell connected to the bit line /BL ("H" data) is charged to the level of Vdd. The storage node SN of the memory cell connected to the bit line BL ("L" data) attains to Vbb (<0).

Therefore, when the storage nodes SN of adjacent memory cells are charged to opposite potentials, the potential difference between mutually adjacent storage nodes will be (Vdd+|Vbb|).

Thus, in the semiconductor memory device 1000 in accordance with the first embodiment, the potential difference between the storage nodes can be made higher than in the conventional semiconductor memory device. Therefore, the ability to detect the short-circuit between the storage nodes can be enhanced.

Further, in the configuration described above, a higher stress than in the conventional semiconductor memory device can be applied, and hence the test time can be reduced.

Further, by performing the detection test in the wafer test stage, it becomes possible not only to detect a defective cell but also to replace the defective cell with a redundant cell. This improves production yield.

Further, in the first embodiment, as a negative potential generated internally is used, increase of circuit components to realize the present function can be avoided.

If an increased positive potential, rather than a negative potential, is applied in order to increase the potential difference, excessive stress will be applied to portions to which application of the stress is unnecessary, other than the bit lines and the memory cells, and hence, excessive stress will be exerted on the dielectric film between the storage node and the cell plate unless the cell plate potential Vcp is changed.

By contrast, according to the first embodiment, the potential difference is widened by utilizing a negative potential, and therefore stress to unrelated portions other than the storage nodes can be avoided.

Second Embodiment

Figure 11:
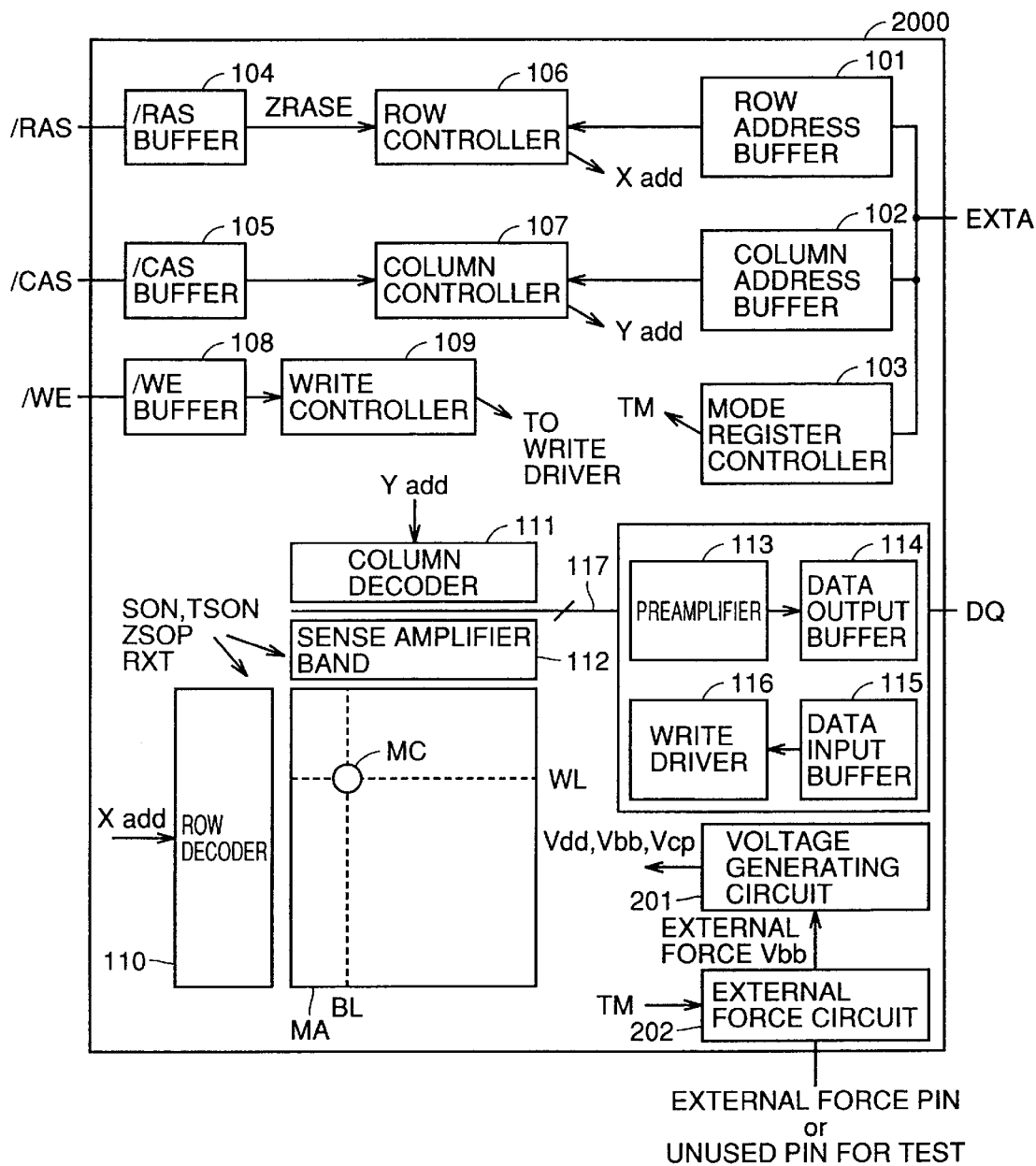
FIG. 11 is a block diagram schematically representing an overall configuration of a semiconductor memory device 2000 in accordance with a second embodiment.

The configuration in accordance with the second embodiment will be described with reference to FIG. 11. Referring to FIG. 11, the semiconductor memory device 2000 includes memory array MA, row address buffer 101, column address buffer 102, mode register controller 103, /RAS buffer 104, /CAS buffer 105, row controller 106, column controller 107, /WE buffer 108, write controller 109, row decoder 110, column decoder 111, sense amplifier band 112, preamplifier 113, data output buffer 114, data input buffer 115, write driver 116, a voltage generating circuit 201, and an external force circuit 202.

External force circuit 202 receives a negative voltage Vbb for the test mode (external force Vbb) from a specific dedicated pin (external force pin) or a pin not used in the test mode (unused pin for the test), in response to an activated test mode signal TM.

Voltage generating circuit 201 generates, as the voltage generating circuit 120 in accordance with the first embodiment, substrate voltage Vbb, internal power supply voltage Vdd, cell plate voltage Vcp and the like, in the normal operation mode. When the external force Vbb is received in the test mode, voltage generating circuit 201 outputs the external force Vbb, in place of the internally generated substrate voltage Vbb, to node N3.

As described above, in the semiconductor memory device 2000 in accordance with the second embodiment, in the test mode in which a short-circuit between the storage nodes is detected, an externally applied negative voltage may be used as the "L" data.

As a result, as in the first embodiment, the ability to detect a short-circuit is enhanced, and the test time can be reduced. Further, production yield is improved.

As compared with the first embodiment in which the bit lines BL and /BL are charged/discharged by the substrate voltage Vbb in operation, current consumption can be reduced. More specifically, it is possible to supply the negative potential stably, and the test and the chip operation can be stabilized.

Third Embodiment

In a test conducted in order to detect any short-circuit, generally, a mode in which an internal voltage is increased, such as a stress mode, is often used to enhance detection ability. When the voltage inside the chip is increased, a high voltage is applied to the dielectric film between the storage node and the cell plate of the memory cell, applying a stress.

Typically, in order to alleviate the voltage burden on the dielectric film, an intermediate potential between the "H" potential and the "L" potential to which the storage nodes are charged, is applied to the cell plate.

Figure 12:
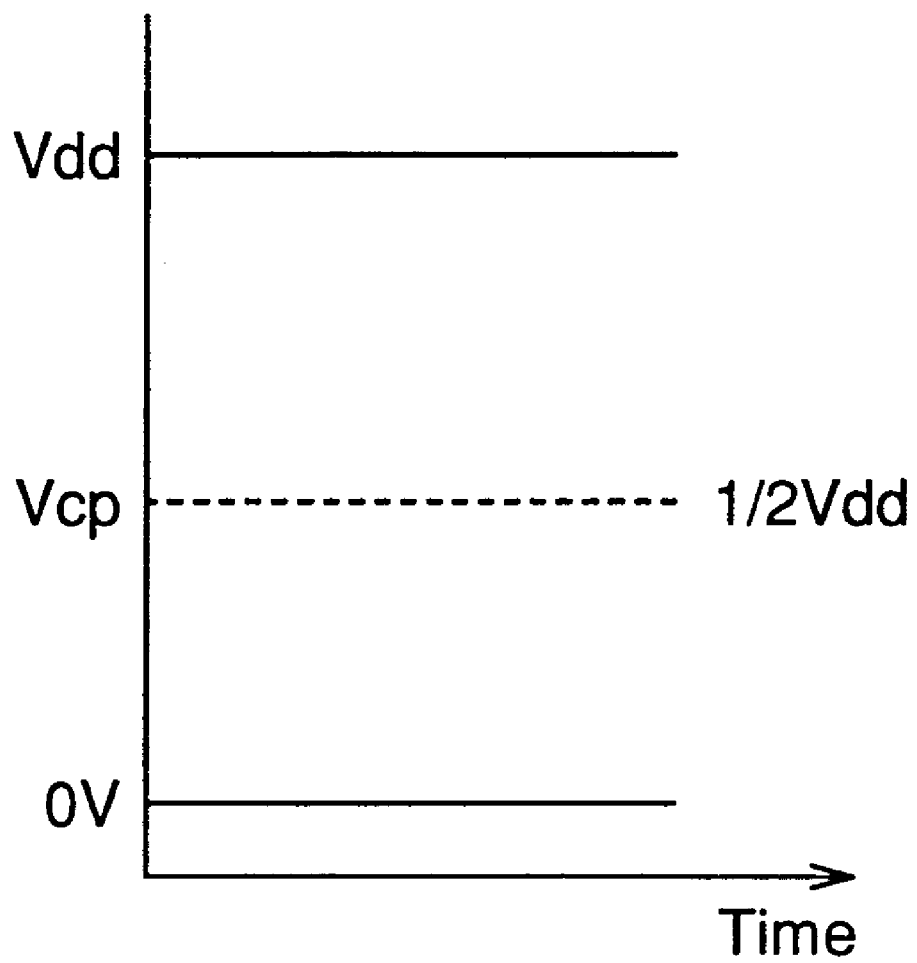
FIG. 12 is an illustration related to a cell plate voltage Vcp in the conventional semiconductor memory device.

Conventionally, the "L" potential has been 0V . Therefore, the intermediate potential applied to the cell plate is ½Vdd, as shown in FIG. 12.

In the third embodiment, a negative potential is used as the "L" potential in the test mode, and the level of the cell plate voltage Vcp is adjusted so as to reduce burden on the dielectric film.

Figure 13:
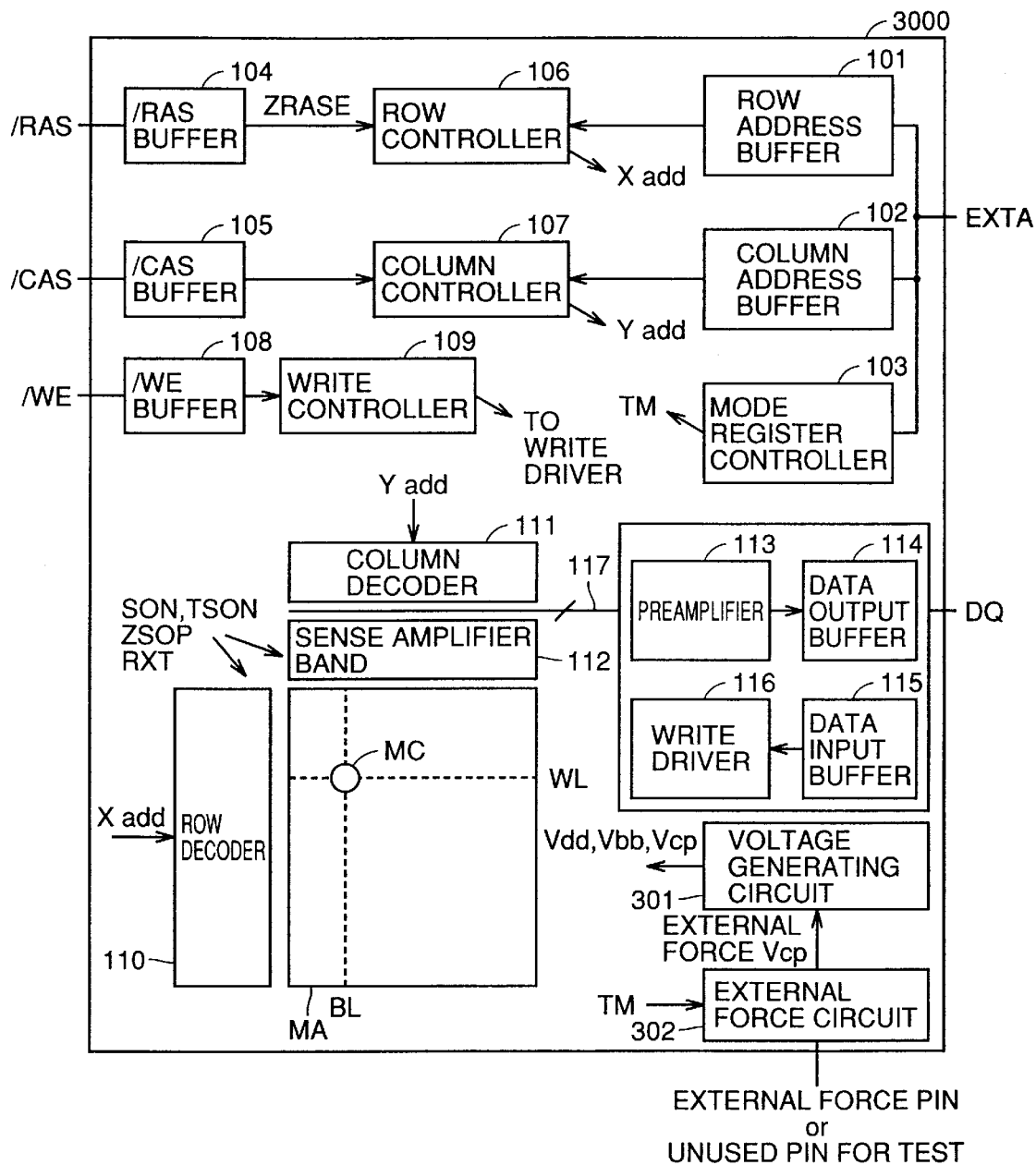
FIG. 13 is a block diagram representing an overall configuration of a semiconductor memory device 3000 in accordance with a third embodiment.

The configuration in accordance with the third embodiment will be described with reference to FIG. 13. As can be seen from FIG. 13, semiconductor memory device 3000 includes memory array MA, row address buffer 101, column address buffer 102, mode register controller 103, /RAS buffer 104, /CAS buffer 105, row controller 106, column controller 107, /WE buffer 108, write controller 109, row decoder 110, column decoder 111, sense amplifier band 112, preamplifier 113, data output buffer 114, data input buffer 115, write driver 116, a voltage generating circuit 301 and an external force circuit 302.

External force circuit 302 receives a cell plate voltage Vcp for the test mode (external force Vcp) from a particular dedicated pin (external force pin) or a pin not used in the test mode (unused pin for the test), in response to the activated test mode signal TM, and outputs the voltage to voltage generating circuit 301.

Voltage generating circuit 301 generates, as the voltage generating circuit 120 in accordance with the first embodiment, substrate voltage Vbb, internal power supply voltage Vdd, cell plate voltage Vcp and the like in the normal operation mode. Upon reception of the external force Vcp in the test mode, voltage generating circuit 201 outputs the external force Vcp, in place of the internally generated cell plate voltage Vcp, as the cell plate voltage.

Figure 14:
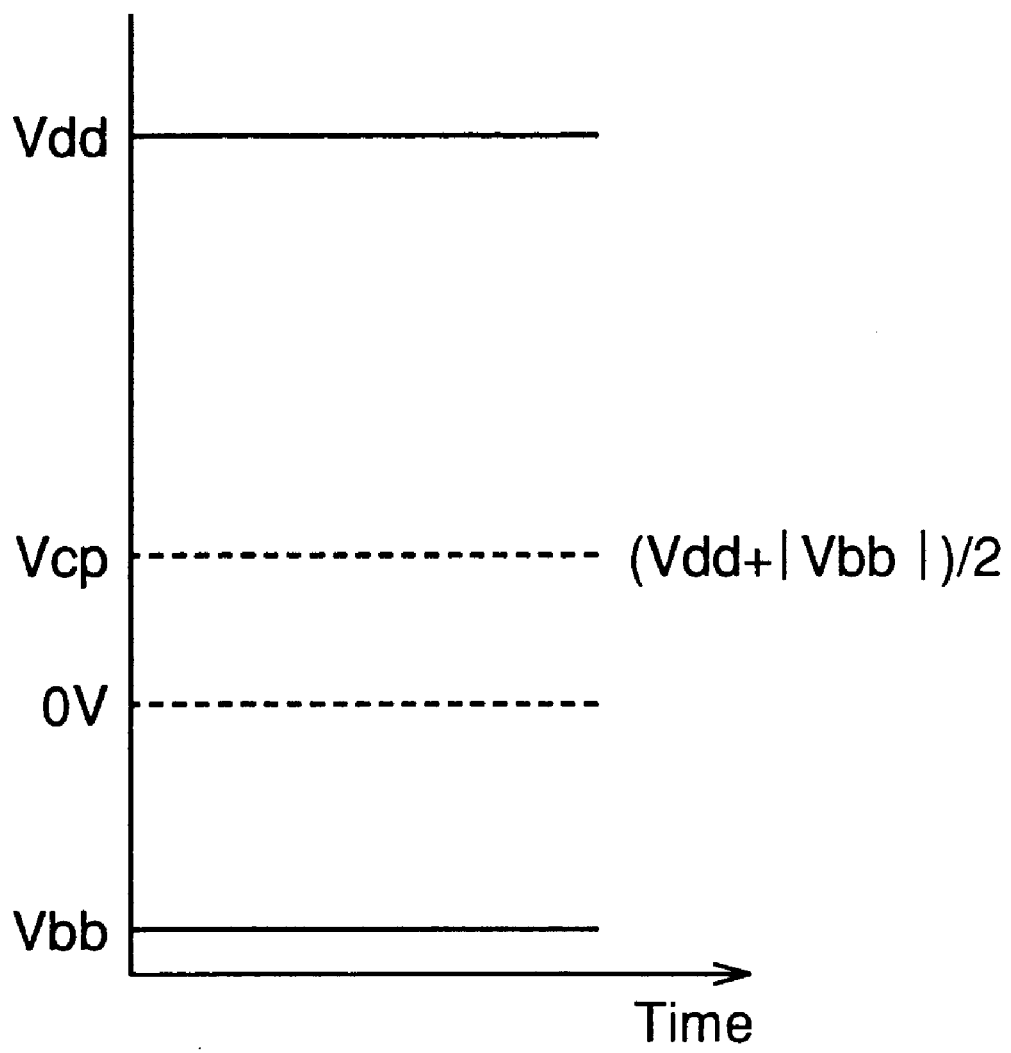
FIG. 14 is an illustration related to the cell plate voltage Vcp in the test mode in the semiconductor memory device 3000 in accordance with the third embodiment.

As described above, in the present invention, the potential difference between the "H" data and "L" data charged in the storage nodes will be (Vdd+|Vbb|). Therefore, in the test mode, a voltage at the level of (Vdd+|Vbb|)/2 is supplied externally to the external force circuit 302 as shown in FIG. 14, and therefore, the cell plate voltage Vcp attains to (Vdd+|Vbb|)/2 in the test mode.

As to the negative potential corresponding to the "L" data in the test mode may be the substrate voltage Vbb as in the first embodiment, or it may externally supplied as in the second embodiment.

As a result, in addition to the effects attained by the first and the second embodiments, the burden on the dielectric film between the storage node and the cell plate can be alleviated. In the test in which a high stress is applied, a margin for the chip can be increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a memory cell array including memory cells each including a memory cell capacitor storing charges and a memory cell transistor, word lines connected to gates of said memory cell transistors, and bit lines connected to storage nodes of said memory cell capacitors; and
    a sense amplifier circuit connected to said bit lines and sensing said charges stored in said memory cells as data; wherein
    said sense amplifier circuit amplifies said bit line to a ground potential or a positive power supply potential in a normal operation mode, and amplifies said bit line to said positive power supply potential or a negative potential in a test mode; and
    a supplying circuit supplying a lower cell plate voltage than that in said normal operation mode to a cell plate of said memory cell capacitor in said test mode.

2. The semiconductor memory device according to claim 1, further comprising
    an activating signal generating circuit generating an activating signal controlling activation of said sense amplifier circuit in said normal operation mode, and generating a test activating signal controlling activation of said sense amplifier circuit in said test mode; wherein
    said sense amplifier circuit includes a circuit setting said bit line to said ground potential when said activation signal is activated, and setting said bit line to said negative potential when said test activating signal is activated.

3. The semiconductor memory device according to claim 2, wherein
    a substrate potential of said memory cell transistor is used as said negative potential.

4. The semiconductor memory device according to claim 2, wherein
    said negative potential is externally supplied.

5. The semiconductor memory device according to claim 2, wherein
    in said test mode, mutually adjacent storage nodes are set to said positive power supply potential and said negative potential.

* * * * *